(12) United States Patent
Takahashi

(10) Patent No.: US 7,868,242 B2
(45) Date of Patent: Jan. 11, 2011

(54) THERMOELECTRIC CONVERSION MODULE

(75) Inventor: Koh Takahashi, Tokyo (JP)

(73) Assignee: Universal Entertainment Corporation, Tokyo (JP)

( * ) Notice: Subject to any disclaimer, the term of this patent is extended or adjusted under 35 U.S.C. 154(b) by 607 days.

(21) Appl. No.: 11/630,824

(22) PCT Filed: Jul. 1, 2005

(86) PCT No.: PCT/JP2005/012243

§ 371 (c)(1),
(2), (4) Date: Dec. 22, 2006

(87) PCT Pub. No.: WO2006/004059

PCT Pub. Date: Jan. 12, 2006

(65) Prior Publication Data

US 2009/0133734 A1 May 28, 2009

(30) Foreign Application Priority Data

Jul. 1, 2004 (JP) .............................. 2004-195723

(51) Int. Cl.
*H01L 35/00* (2006.01)
(52) U.S. Cl. ..................... 136/200; 136/203; 136/208; 136/224; 136/230
(58) Field of Classification Search ......... 136/200–242; 423/594.16, 599
See application file for complete search history.

(56) References Cited

U.S. PATENT DOCUMENTS

| | | | |
|---|---|---|---|
| 3,054,840 A | | 9/1962 | Alsing et al. |
| 3,400,452 A | * | 9/1968 | Emley .................... 136/201 |
| 3,522,106 A | | 7/1970 | Debiesse et al. |
| 5,969,290 A | * | 10/1999 | Kagawa et al. .............. 136/201 |

(Continued)

FOREIGN PATENT DOCUMENTS

GB 900888 7/1962

(Continued)

OTHER PUBLICATIONS

Ohtaki et al. "Electrical Transport Properties and High-Temperature Thermoelectric Performance of (Ca0.9M0.1)MnO3 (M=Y, La, Ce, Sm, In, Sn, Sb, Pb, Bi)." Journal of Solid State Chemistry 120, 105-111 (1995).*

(Continued)

*Primary Examiner*—Scott Kastler
*Assistant Examiner*—Brian Walck
(74) *Attorney, Agent, or Firm*—McGinn IP Law Group

(57) ABSTRACT

A thermoelectric conversion module includes a tubular element unit having a plurality of ring-like thermoelectric elements coaxially arranged with air as an insulator sandwiched inbetween. The ring-like thermoelectric element is covered approximately entirely with electrodes at its outer circumference surface and inner circumference surface, respectively, and generates electricity by temperature difference between the outer circumference surface and the inner circumference surface. A lead wire electrically connects the electrode covered on the outer circumference surface of one ring-like thermoelectric element among the plurality of ring-like thermoelectric elements to the electrode covered on the inner circumference surface of another ring-like thermoelectric element adjacent to the one ring-like thermoelectric element. A doubled cylindrical support unit 41 includes a SUS tube whose outer circumference surface supports the tubular element unit and a SUS tube whose inner circumference surface supports the tubular element unit.

14 Claims, 7 Drawing Sheets

U.S. PATENT DOCUMENTS

| | | |
|---|---|---|
| 6,096,966 A | 8/2000 | Nishimoto et al. |
| 2003/0209014 A1 | 11/2003 | Chang et al. |
| 2007/0157960 A1* | 7/2007 | Funahashi .................. 136/238 |

FOREIGN PATENT DOCUMENTS

| | | | |
|---|---|---|---|
| GB | 1118183 | | 6/1968 |
| JP | 3-66182 | | 3/1991 |
| JP | 7-106641 | | 4/1995 |
| JP | 09-036439 | * | 2/1997 |
| JP | 9-51126 | | 2/1997 |
| JP | 2775410 | | 5/1998 |
| JP | 2003-282966 | | 10/2003 |
| WO | WO 2004/049463 A1 | | 6/2004 |

OTHER PUBLICATIONS

Ichiro Matsubara, Ryoji Funahashi, Tomonari Takeuchi and Satoshi Sodeoka, Fabrication of an All-Oxide Thermoelectric Power Generator, Applied Physics Letters, vol. 78, No. 23, Jun. 4, 2001.

European Search Report dated Dec. 23, 2009.

* cited by examiner

※Electrodes 23a, 23b are omitted.

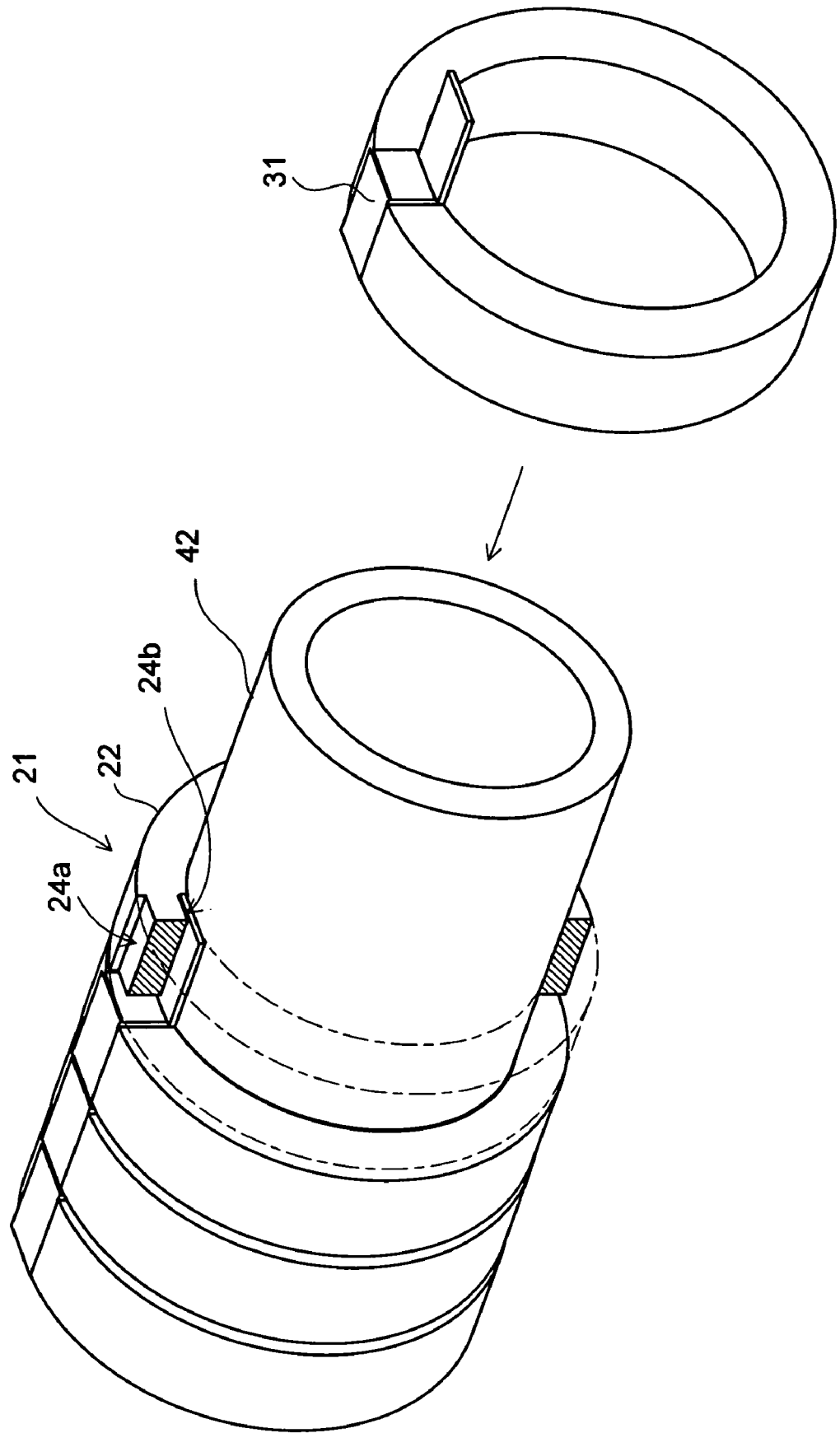

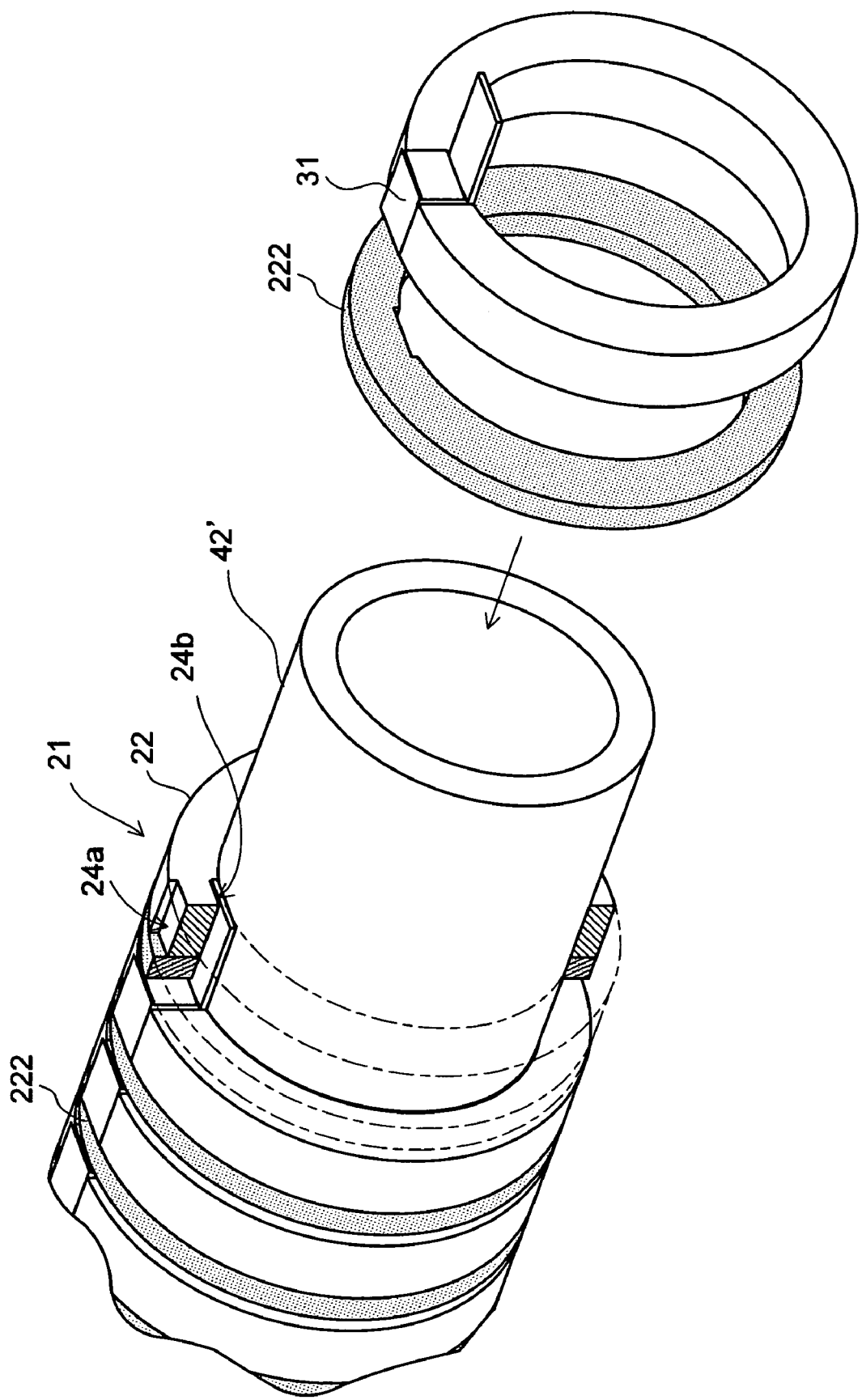

THERMOELECTRIC CONVERSION MODULE

TECHNICAL FIELD

The present invention relates to a thermoelectric conversion module, and relates to a thermoelectric conversion module comprising a large number of thermoelectric elements.

BACKGROUND ART

Thermoelectric conversion means the conversion of thermal energy to electric energy with use of the Peltier effect or the Seebeck effect. By utilizing the thermoelectric conversion, electricity is taken out from heat flow using the Seebeck effect, or electric current is applied to a material using the Peltier effect, to be able to bring about an endothermic phenomenon or an exothermic phenomenon. Also, the thermoelectric conversion is characterized by no generation of excessive waste at the time of energy conversion due to direct conversion, ability to make efficient use of exhaust heat, maintenance free due to no provision of movable parts such as a motor and a turbine, and so on, and thus attracts attention as a technique for high-efficiency use of energy.

The thermoelectric conversion usually uses metal or semiconductor elements called thermoelectric elements. As shown in FIG. 6, two kinds of thermoelectric elements, a p-type thermoelectric element 102 and an n-type thermoelectric element 103, are conventionally used. When one of the two thermoelectric elements, the p-type thermoelectric element 102 and the n-type thermoelectric element 103, is heated while the other is cooled, in a state where they are electrically connected to each other by an electrode 101, this temperature difference generates voltage. Let us explain this in FIG. 6; when a lower portion 105 of a pi-type (π-type) element 104 that is formed in a pi shape by connecting the p-type thermoelectric element 102 to the n-type thermoelectric element 103 is heated while an upper portion 106 is cooled, thermal energy absorbed from the lower portion 105 is converted into electric energy, and electric current flows in a direction from A to B.

However, the thermoelectric conversion by a single pi-type element cannot exert practical electricity due to insufficient energy output. Thus, in order to obtain practical electricity by the thermoelectric conversion, the thermoelectric conversion is preferably performed by integrating a plurality of pi-type elements. A unit that performs the thermoelectric conversion by integrating a plurality of thermoelectric elements to obtain practical electricity in such a manner is referred to as a thermoelectric conversion module (hereinafter abbreviated as "module").

FIG. 7 is a perspective view showing a use example of a conventional module. A conventional module 111 was in a flat-plate structure in which the aforementioned many p-type thermoelectric elements (not shown) and n-type thermoelectric elements (not shown) are linearly arranged inside, and in which the module is fixed with an electrically insulated fixing member 115. Also, since the conventional module was regarded as a separate element from a fluid channel acting as a heat source, the module 111 was attached to a flat surface 113 formed outside a cylindrical fluid channel 112 as shown in FIG. 7.

In order to obtain electric output as a result of the thermoelectric conversion in the module 111, high-temperature (or low-temperature) fluid 114 needed to flow inside the cylindrical fluid channel 112 to generate temperature difference between a surface (inner surface) that the internal portion (flat surface 113) of the module 111 contacts and a surface (outer surface) opposed to it. At this point, in order to increase the temperature difference between the inner surface side and the outer surface side of the module 111 as much as possible with the aim of obtaining as much output as possible, it was necessary to let the temperature of the inner surface of the module 111 as close as possible to the temperature of the fluid 114 flowing inside the cylindrical fluid channel 112. Accordingly, in order to conduct the heat of the fluid 114 to the inner surface of the module 111 as much as possible, the module 111 was covered with the fixing member 115 and was fixed with screws 116 tightly.

In such a manner, the conventional flat-plate structured module needed to be attached to the fluid channel by using the fixing member and the screws, and as a result, an electric generating system using the conventional flat-plate structured module had a complicated structure.

Thereafter, a tubular module having a simpler structure than that of the aforementioned flat-plate structured module was developed (refer to Patent Document 1).

[Patent Document 1] Japanese patent publication No. 2775410

DISCLOSURE OF THE INVENTION

Problems to be Solved by the Invention

However, as shown in FIG. 8, a developed tubular module 121 had a structure in which a p-type thermoelectric element 124a and an n-type thermoelectric element 124b are arranged alternately in a rotation symmetric form between coaxial doubled cylindrical tubes consisting of an inner tube 122 and an outer tube 123, and in which the p-type thermoelectric element 124a and the n-type thermoelectric element 124b are connected alternately by an electrode 125. In the case where the two kinds of thermoelectric elements, the p-type thermoelectric elements and the n-type thermoelectric elements, were used in such a manner, the completed module required extensive time and work in assembly since the assembly procedure was complicated, and the number of parts constituting the module was large. Thus, it eventually became a high cost product and could not be regarded as sufficiently practical.

The present invention has been made to solve the foregoing problems, and an object of the present invention is to provide a thermoelectric conversion module enabling cost reduction by reducing the number of parts, making the assembly procedure simpler, reducing time and work required for assembly, and so on.

Means for Solving the Problems

In order to achieve the above object, the present invention provides the following.

According to a first aspect of a thermoelectric conversion module equipping: a tubular element unit having a plurality of ring-like thermoelectric elements coaxially arranged with an insulator sandwiched inbetween, said ring-like thermoelectric element is a ring-like thermoelectric element, is covered approximately entirely with electrodes at its outer circumference surface and inner circumference surface, respectively, and generates electricity by temperature difference between said inner circumference surface and said outer circumference surface; a lead body electrically connecting an electrode covered on the outer circumference surface of one ring-like thermoelectric element among said plurality of ring-like thermoelectric elements to an electrode covered on the inner circumference surface of another ring-like thermoelectric element adjacent to this one ring-like thermoelectric element; and a doubled cylindrical support unit consisting of an electrically insulated inner tube that internally touches said tubular element unit and whose outer circumference surface supports said tubular element unit and an electrically insulated outer tube that externally touches said tubular element unit and whose inner circumference surface supports said tubular element unit.

In accordance with the invention in the first aspect, a doubled cylindrical support unit consisting of an electrically insulated inner tube that internally touches the tubular element unit and whose outer circumference surface supports the tubular element unit and an electrically insulated outer tube that externally touches the tubular element unit and whose inner circumference surface supports the tubular element unit is provided. Accordingly, the thermoelectric conversion module according to the present invention can be assembled easily in comparison to a conventional thermoelectric conversion module in which a plurality of thermoelectric elements needed to be arranged in a rotation symmetric form between an inner tube and an outer tube since it has a simple structure in which the tubular element unit is supported by the inner tube and the outer tube. Thus, it is possible to reduce time and work required for assembly and enable cost reduction.

Meanwhile, the above thermoelectric conversion module may comprise a tubular element unit formed by coaxially arranging a plurality of ring-like thermoelectric elements each of whose outer circumference surface and inner circumference surface are covered with electrodes, respectively, so as to be insulated mutually, a lead body electrically connecting an outer circumference surface electrode of one said thermoelectric element to an inner circumference surface electrode of the other said thermoelectric element between the adjacent thermoelectric elements and a doubled cylindrical support unit consisting of an inner tube that has been fitted in said tubular element unit (whose outer circumference surface has been insulated) and an outer tube in which said tubular element unit is to be fitted (whose inner circumference surface has been insulated).

This lead body can electrically connect the plurality of ring-like thermoelectric elements in series in a direction along a center axis of the ring shape. By doing so, desired inter-terminal voltage taken out from both ends of the above tubular element unit can be obtained. That is, when higher voltage is preferred, more ring-like thermoelectric elements just need to be arranged in a direction along the center axis. At this time, the temperature on the inner circumference surface side and the temperature on the outer circumference surface side are assumed to be approximately constant respectively along the axis direction, but the longer the length becomes, the more difficult it is for this assumption to be effected. Thus, the length in the axis direction, that is, the number of the ring-like thermoelectric elements, can be determined in consideration to these factors. In general, it is thought that the number of the ring-like thermoelectric elements is preferably 50 to 200 pieces.

The above inner tube and outer tube may have a function of limiting movement of fluid substances such as gas, liquid, particles, etc. residing on the inner circumference surface side and outer circumference surface side of the above thermoelectric conversion module. Also, the above inner tube and outer tube can have a function of making the temperature of the inner circumference surface electrode and the outer circumference surface electrode of each thermoelectric element in the above thermoelectric conversion module relatively constant within each electrode. Further, the above inner tube and outer tube can have a structure that enables efficient heat transfer from various kinds of fluid substances such as gas, liquid, particles, etc. moving nearby. For example, macro- or micro-fins or the likes can be attached.

Also, other than the above inner tube and outer tube, a heat blocking member having the above functions can be provided. This heat blocking member can include a heat blocking body such as, for example, the above inner tube and/or outer tube. The heat blocking body can include, for example, an insulated ring body to be inserted between the plurality of ring-like thermoelectric elements. Such a ring body can electrically insulate respective ring-like thermoelectric elements in an axis direction along the center axis of the plurality of ring-like thermoelectric elements. Such a ring body can maintain a mutual appropriate space between the plurality of ring-like thermoelectric elements and can function as a structure auxiliary member that can maintain the structure of the entire thermoelectric conversion module.

According to a second aspect of the thermoelectric conversion module as described in the first aspect of the present invention, wherein said plurality of ring-like thermoelectric elements are thermoelectric elements all of which a sintered body made of the same kind of components has been processed into.

According to a third aspect of the thermoelectric conversion module as described in the second aspect of the present invention, wherein said sintered body made of the same kind of components is a composite metal oxide essentially containing calcium and manganese and further containing a trivalent or higher metal element.

In accordance with the second and the third aspects of the present invention, the plurality of ring-like thermoelectric elements have been obtained by processing the sintered body made of entirely the same kind of components. Thus, the thermoelectric conversion module is assembled using the thermoelectric elements obtained by processing the sintered body made of the same kind of components. Accordingly, since it is not necessary to check whether or not the arranging order is correct in comparison to a conventional case in which two kinds of different thermoelectric elements are arranged alternately to assemble a thermoelectric conversion module, it is possible to reduce time and work required for assembly. Also, according to the present invention, the thermoelectric elements of the same kind only need to be purchased, and thus the purchase unit cost can be lowered more than in the case of purchasing two kinds of different thermoelectric elements as in the conventional case, which enables cost reduction.

According to a fourth aspect of a thermoelectric conversion module in which a plurality of thermoelectric elements each formed in a ring shape are arranged coaxially along a center axis of said ring shape with a predetermined space therebetween, said thermoelectric element has an outer circumference surface electrode and an inner circumference surface electrode that substantially cover an inner circumference surface and an outer circumference surface, respectively, and generates predetermined electromotive force based on temperature difference between said outer circumference surface and said inner circumference surface, said thermoelectric conversion module comprising: a lead body electrically connecting an arbitrary pair of adjacent first and second thermoelectric elements among said plurality of thermoelectric elements, said lead body electrically connects the outer circumference surface electrode of said first thermoelectric element to the inner circumference surface electrode of said second thermoelectric element; and a heat blocking member for limiting movement of substances such as gas, electricity and heat on the outer circumference surface side and the inner circumference surface side between the inner circumference surfaces and the outer circumference surfaces of said plurality of thermoelectric elements.

Here, the above outer circumference surface and inner circumference surface mean a surface facing the outer side (not inner side of a tube) and a surface facing the inner side (not outer side of the tube) of a ring shape (can be referred to as a circular shape) into which the cylindrical tube has been cut in short pieces approximately perpendicular to its axis direction. Also, the center axis of the ring shape may correspond to an axis (or cylindrical axis) of a tube (or cylinder) formed when the ring shape is elongated into a tube shape (or cylindrical shape). Also, it can be thought that it corresponds to, for example, a line formed when the center of the circle forming the ring shape is moved in a width (or length) direction of this ring shape. The word, coaxially, can mean sharing a center axis in such a manner. Further, the above pair of thermoelectric elements can consist of two adjacent thermoelectric elements having substantially the same features. At this time, the two adjacent thermoelectric elements constituting the thermoelectric element pair can be referred to as a "first thermoelectric element" and a "second thermoelectric element" in an order in a predetermined direction along the center axis of the ring shape. For example, when a plurality of ring-like thermoelectric elements (e.g., thermoelectric elements named A, B, C, D, E from the left) are arranged along their center axes (that correspond to a "cylindrical axis" in a case where they substantially form a cylindrical shape as a collective body), any adjacent pair can form the thermoelectric element pair. Specifically, it is A and B, B and C, C and D, or D and E. For example, in an order from the left along this center axis at this time, the thermoelectric element on the left side of each pair (A and B, B and C, C and D, or D and E) can be named a first thermoelectric element on the right side, a second thermoelectric element. If the outer circumference surface electrode of the first thermoelectric element is connected to the inner circumference surface electrode of the second thermoelectric element as above in an arbitrary thermoelectric element pair, serial connection from the outer circumference surface electrode of thermoelectric element A through the inner circumference surface electrode of thermoelectric element E is achieved.

According to the present invention, a doubled cylindrical support unit consisting of an electrically insulated inner tube that internally touches the tubular element unit and whose outer circumference surface supports the tubular element unit and an electrically insulated outer tube that externally touches the tubular element unit and whose inner circumference surface supports the tubular element unit is provided. Accordingly, the thermoelectric conversion module according to the present invention can be assembled easily in comparison to a conventional thermoelectric conversion module in which a plurality of thermoelectric elements needed to be arranged in a rotation symmetric form between an inner tube and an outer tube since it has a simple structure in which the tubular element unit is supported by the inner tube and the outer tube. Thus, it is possible to reduce time and work required for assembly and enable cost reduction.

BRIEF DESCRIPTION OF THE DRAWINGS

FIG. 5A is a schematic view showing a tubular element unit constituting the thermoelectric conversion module.

FIG. 5B is a schematic view showing a tubular element unit constituting a thermoelectric conversion module as another embodiment.

PREFERRED MODE FOR CARRYING OUT THE INVENTION

Hereinafter, an embodiment of the present invention will be described with reference to the drawings.

Figure 1:
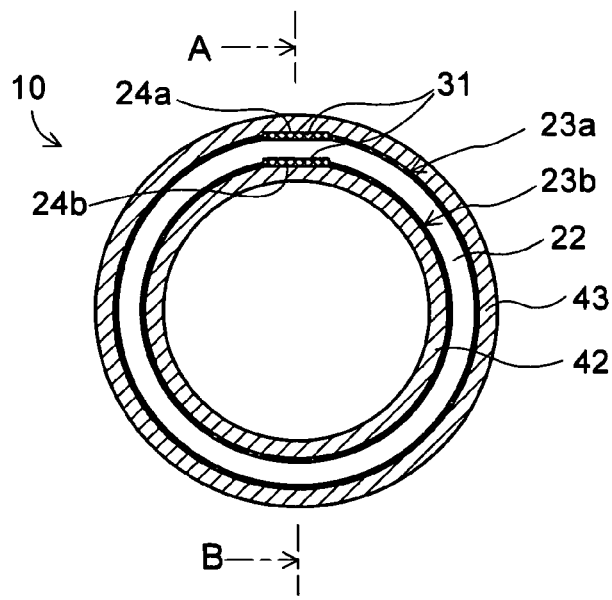
FIG. 1 is a cross-sectional view showing a thermoelectric conversion module.
Figure 2:
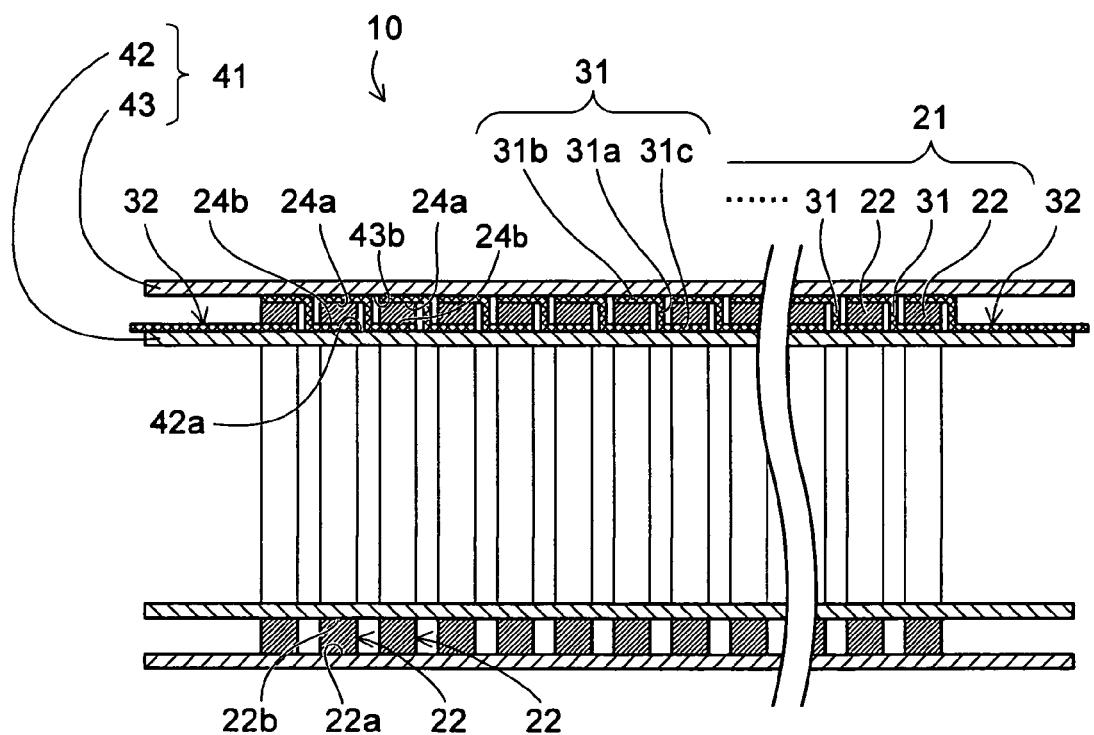
FIG. 2 is a cross-sectional view along the A-B line in the longitudinal direction of the thermoelectric conversion module in FIG. 1.

FIGS. 1 and 2 show a basic structure of the present invention; FIG. 1 is a cross-sectional view of a thermoelectric conversion module 10, and FIG. 2 is a cross-sectional view along the A-B line in the longitudinal direction of the thermoelectric conversion module 10 in FIG. 1. As shown in FIG. 2, the thermoelectric conversion module 10 comprises a tubular element unit 21 in which a plurality of ring-like thermoelectric elements 22 are coaxially connected by lead wires 31. A space is provided between respective ring-like thermoelectric elements 22. That is, the plurality of ring-like thermoelectric elements 22 are coaxially provided in parallel with air as an example of an insulator sandwiched inbetween. That is to say, the plurality of ring-like thermoelectric elements 22 are coaxially arranged so as to be insulated mutually. This tubular element unit 21 is supported by a doubled cylindrical support unit 41 consisting of a SUS tube 42 whose outer circumference surface 42a has been electrically insulated and a SUS tube 43 whose inner circumference surface 43b has been electrically insulated. That is, the doubled cylindrical support unit 41 consists of the SUS tube 42 that is an inner tube fitted in the tubular element unit 21 and the SUS tube 43 that is an outer tube in which the tubular element unit 21 is fitted. That is to say, the inner circumference surface 43b of the SUS tube 43 externally touches the tubular element unit 21, and the outer circumference surface 42a of the SUS tube 42 internally touches the tubular element unit 21. That is to say, an inner circumference surface 22b of the ring-like thermoelectric element 22 externally touches the outer circumference surface 42a of the SUS tube 42, and an outer circumference surface 22a of the ring-like thermoelectric element 22 internally touches the inner circumference surface 43b of the SUS tube 43.

Accordingly, since the thermoelectric conversion module 10 has a simple structure in which the tubular element unit 21 is supported by the SUS tube 42 and the SUS tube 43, it is possible to reduce the number of parts constituting the thermoelectric conversion module and assemble the thermoelectric conversion module easily, in comparison to a conventional thermoelectric conversion module in which a plurality of thermoelectric elements needed to be arranged in a rotation symmetric form between the SUS tube 42 and the SUS tube 43. Thus, it is possible to reduce time and work required to assemble the thermoelectric conversion module and enable cost reduction.

Also, in the present invention, not the SUS tubes but tubes made of other materials may be used as long as they can support the tubular element unit 21 and have relatively excellent heat conductivity.

Also, the plurality of ring-like thermoelectric elements 22 are thermoelectric elements all of which a sintered body made of the same kind of components has been processed into, and the sintered body may be a sintered body containing any elements, but it is preferably a composite metal oxide essentially containing calcium and manganese and further containing a trivalent or higher metal element such as yttrium, manganese, etc. This enables to further improve heat resistance under a high temperature. Such a sintered body is exemplified by a perovskite-type $CaMnO_3$-based composite oxide, and so on. The perovskite-type $CaMnO_3$-based composite oxide is further preferably expressed by a general formula $Ca_{(1-x)}M_xMnO_3$ (where M is a trivalent or higher metal element, and $0.001 \leq x \leq 0.05$). Also, the ring-like thermoelectric element 22 is preferably 10 mm to 40 mm in external diameter, 5 mm to 35 mm in internal diameter and 2 mm to 5 mm in thickness.

In such a manner, the plurality of ring-like thermoelectric elements 22 are ones obtained by processing the sintered body made of entirely the same kind of components. Thus, since the thermoelectric conversion module 10 can be assembled using the ring-like thermoelectric elements 22 obtained by processing the sintered body made of the same kind of components, it is not necessary to check whether or not two kinds of different thermoelectric elements are arranged alternately to assemble the module as in the case of assembling the conventional thermoelectric conversion module. Accordingly, it is possible to reduce time and work required for assembly. Also, according to the present invention, the thermoelectric elements of the same kind only need to be purchased, and thus the purchase unit cost can be lowered more than in the case of purchasing two kinds of different thermoelectric elements as in the conventional case, which enables cost reduction.

Also, as shown in FIGS. 1 and 2, on the outer circumference surface 22a of the ring-like thermoelectric element 22 is formed a recess 24a. On the other hand, on the inner circumference surface 22b of the ring-like thermoelectric element 22 is formed a recess 24b positioning back to back with the recess 24a. That is, a pair of recesses 24a, 24b is provided on the outer circumference surface 22a and the inner circumference surface 22b of the ring-like thermoelectric element 22. Meanwhile, the recesses 24a, 24b only need to be formed in a shape so that the cross-sectional form of the lead wire 31 is to be fitted therein.

The outer circumference surface 22a and the inner circumference surface 22b of the ring-like thermoelectric element 22 are covered approximately entirely with electrodes 23a, 23b, respectively. In the same manner, the recesses 24a, 24b are covered approximately entirely with the electrodes 23a, 23b, respectively. The electrodes 23a, 23b are preferably a metal such as gold, silver, etc. having lower electric resistance than that of the ring-like thermoelectric element 22. When a material of the electrodes 23a, 23b is silver, the electrodes 23a, 23b are formed by a silver paste method in which silver small particles are processed into a paste state and are sintered at a high temperature, a wet plating method in which silver is chemically extracted or the like, but the electrodes 23a, 23b may be formed by another method.

Also, the lead wire 31 electrically connects the recess 24a on the outer circumference surface 22a of one ring-like thermoelectric element 22 to the recess 24b on the inner circumference surface 22b of another ring-like thermoelectric element 22 adjacent to the one ring-like thermoelectric element 22. That is, the lead wire 31 electrically connects the electrode 23a on the outer circumference surface 22a of one ring-like thermoelectric element 22 to the electrode 23b on the inner circumference surface 22b of the other ring-like thermoelectric element 22 between the adjacent ring-like thermoelectric elements 22.

Figure 3:
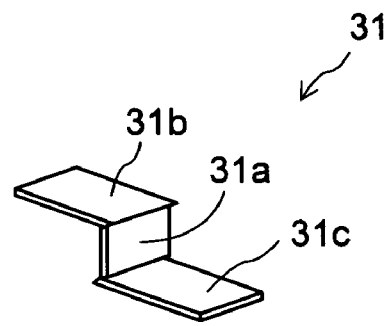
FIG. 3 is a perspective view of a lead wire constituting the thermoelectric conversion module.

Here, the structure of the lead wire 31 is explained with reference to FIGS. 2 and 3. FIG. 3 is a perspective view of the lead wire 31. That is, the lead wire 31 is constituted by a flat plate 31a, a flat plate 31b extending horizontally to the flat plate 31a from one end of the flat plate 31a and a flat plate 31c extending from the other end of the flat plate 31a in the opposite direction from the flat plate 31b. Then, as shown in FIG. 2, the flat plate 31b of the lead wire 31 is fitted in the recess 24a of one ring-like thermoelectric element 22, and the flat plate 31c of the lead wire 31 is fitted in the recess 24b of another ring-like thermoelectric element 22 adjacent to this ring-like thermoelectric element 22. On the other hand, the flat plate 31a of the lead wire 31 fitted in ring-like thermoelectric elements 22 extends between one ring-like thermoelectric element 22 and another ring-like thermoelectric element 22 adjacent to this ring-like thermoelectric element 22 in parallel with the longitudinal direction of the ring-like thermoelectric elements 22 (refer to FIG. 2). Accordingly, when the ring-like thermoelectric element 22 is heated from its outer circumference surface 22a side, heat is emitted in the air from the flat plate 31a that is exposed to the air before heat is conducted from the flat plate 31b to the flat plate 31c via the flat plate 31a (refer to FIG. 2). Thus, it is possible to prevent lowering of the thermoelectric conversion efficiency resulting from conduction of heat generated on the outer circumference surface 22a side from the flat plate 31b to flat plate 31c.

Meanwhile, the lead wire 31 is preferably a metal such as gold, silver, etc. having lower electric resistance than that of the ring-like thermoelectric element 22 in the similar manner to the electrodes 23a, 23b. Also, in the lead wire 31, the proportion of its cross-sectional area to the average area of the electrode 23a (or electrode 23b) is preferably 2:1000 to 5:1000, and more preferably 25:1000 to 35:1000. It is because a case where the lead wire 31 is too thick is not preferable as it does not bring about temperature difference, and a case where the lead wire 31 is too thin is not preferable as it cannot let electric current flow therein.

When the tubular element unit 21 adopting the above structure is heated from the SUS tube 43 side or the SUS tube 42 side, electromotive force is generated by the temperature difference between the outer circumference surface 22a and the inner circumference surface 22b of the ring-like thermoelectric element 22. The generated electromotive force is supplied to the external loads through electrodes 32.

Meanwhile, in the present embodiment, the "lead wire 31" corresponds to an example of a "lead body" of the present invention, the "SUS tube 42" corresponds to an example of an "inner tube" of the present invention, and the "SUS tube 43" corresponds to an example of an "outer tube" of the present invention.

Embodiment

<Preparation of the Ring-Like Thermoelectric Element>

Figure 4A:
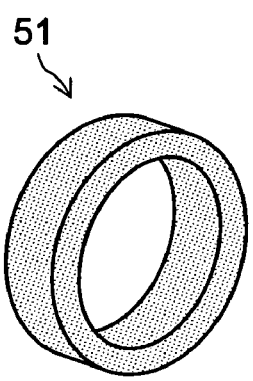
FIG. 4A is a perspective view showing a $Ca_{0.95}Y_{0.05}MnO_3$ ring-like sintered body.
Figure 4B:
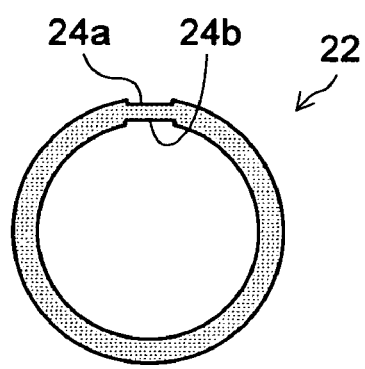
FIG. 4B is a front view of a ring-like thermoelectric element constituting the thermoelectric conversion module.
Figure 4C:
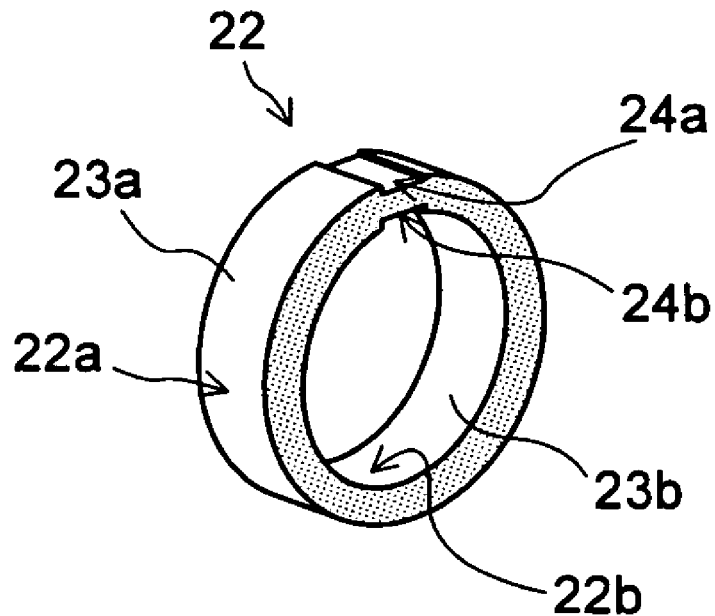
FIG. 4C is a perspective view of the ring-like thermoelectric element whose outer circumference surface and inner circumference surface have been covered approximately entirely with electrodes constituting the thermoelectric conversion module.

A method for preparing the ring-like thermoelectric element is explained with reference to FIGS. 4A to 4C. FIG. 4A is a perspective view showing a $Ca_{0.95}Y_{0.05}MnO_3$ ring-like sintered body 51, FIG. 4B is a front view of the ring-like thermoelectric element 22, and FIG. 4C is a perspective view of the ring-like thermoelectric element 22 whose outer circumference surface 22a and inner circumference surface 22b have been covered approximately entirely with the electrodes 23a, 23b. It is noted that some numerals are omitted in FIGS. 4A and 4C.

Calcium carbonate, manganese carbonate and yttrium oxide were weighed so that Ca/Mn/Y=0.95/1.0/0.05 and underwent wet blending in a ball mill for 18 hours. Thereafter, the wet material was filtered, dried, and calcined in the air at 1000 degrees C for 10 hours. The calcined powder obtained was crushed and then molded by a uniaxial press at 1 t/cm² pressure using a ring-like die. This was sintered in the air at 1150 degrees C. for 5 hours to obtain the $Ca_{0.95}Y_{0.05}MnO_3$ ring-like sintered body 51 shown in FIG. 4A. The sintered body was 20 mm in external diameter, 14 mm in internal diameter and 2.5 mm in thickness. Parts of the outer circumference surface and the inner circumference surface of the ring-like sintered body were cut to form the recesses 24a, 24b in which the lead wire 31 is to be fitted, and the ring-like thermoelectric element 22 shown in FIG. 4B was obtained. Silver paste was applied to the outer circumference surface 22a and the inner circumference surface 22b of this ring-like thermoelectric element 22, and this was baked at 700 degrees C. to obtain the ring-like thermoelectric element 22 whose outer circumference surface 22a and inner circumference surface 22b have been covered approximately entirely with the electrodes 23a, 23b as shown in FIG. 4C.

<Preparation of the Thermoelectric Conversion Module>

Figure 4D:
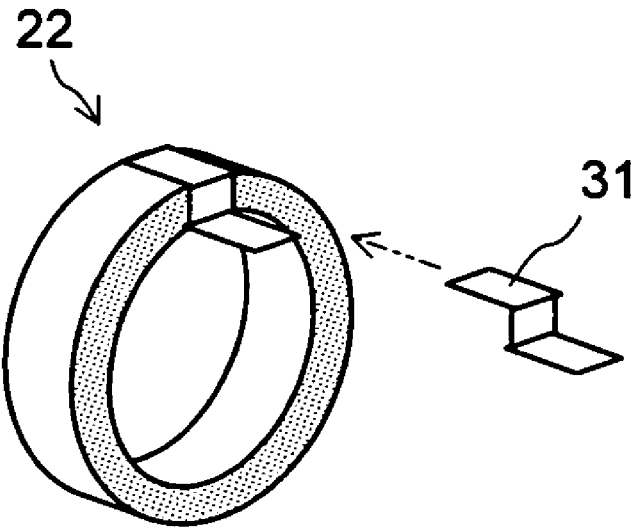
FIG. 4D is a perspective view of the ring-like thermoelectric element with the lead wire.
Figure 6:
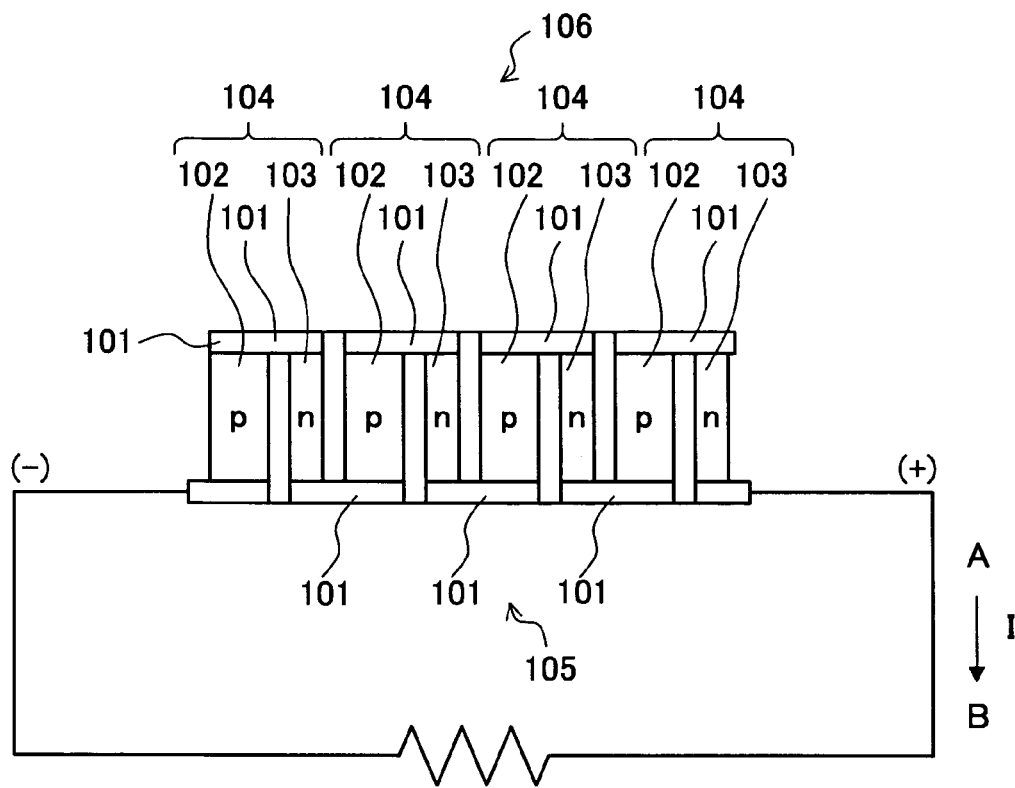
FIG. 6 is a fundamental view showing an example of a conventional thermoelectric conversion module.
Figure 7:
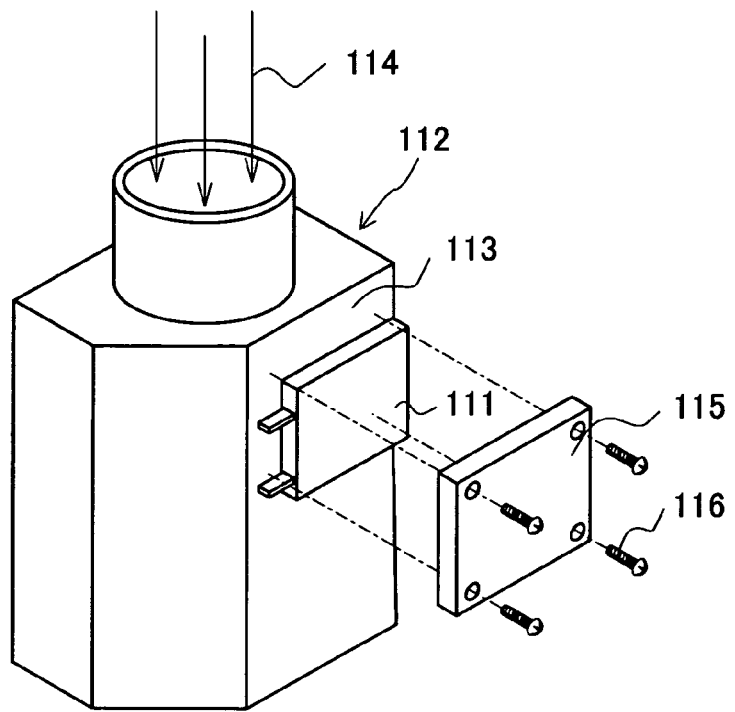
FIG. 7 is a perspective view showing a use example of the conventional thermoelectric conversion module.
Figure 8:
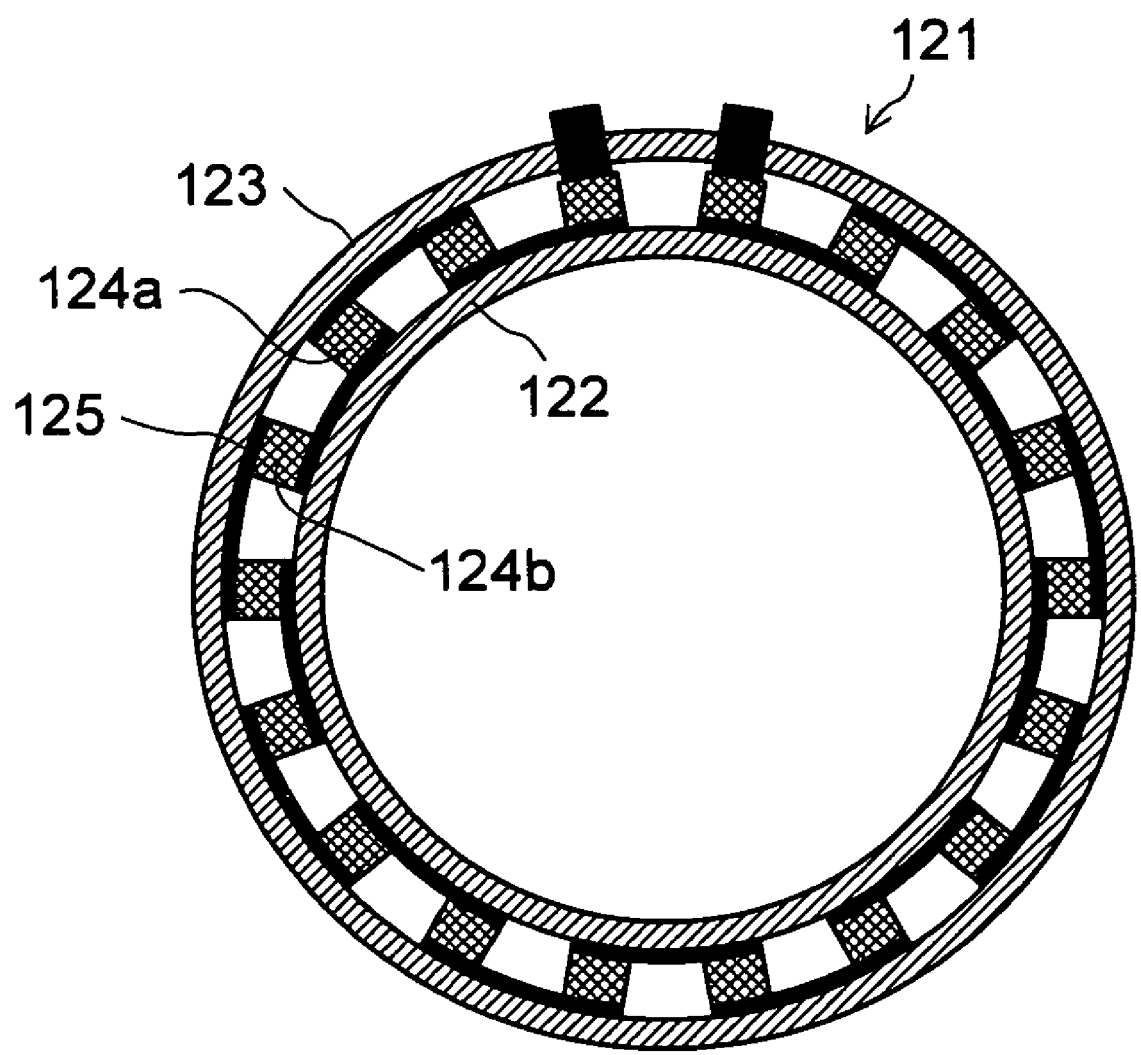
FIG. 8 is a horizontal cross-sectional view showing an example of a conventional thermoelectric conversion module.

A method for preparing the thermoelectric conversion module is explained with reference to FIGS. 2, 4D and 5A. FIG. 4D is a perspective view of the ring-like thermoelectric element 22 with the lead wire. FIG. 5A is a schematic view showing the tubular element unit 21 constituting the thermoelectric conversion module.

As shown in FIG. 4D, one end of the silver plate lead wire 31 (3 mm in width and 100 micrometer in thickness) was fitted in the recess 24a of the ring-like thermoelectric element 22 and was fixed with silver paste to obtain the ring-like thermoelectric element 22 with the lead wire 31 in whose recess 24a one end of the lead wire 31 has been fitted (hereinafter referred to as "lead-wire-attached ring-like thermoelectric element 22"). Then, as shown in FIG. 5A, one lead-wire-attached ring-like thermoelectric element 22 was inserted on the SUS tube 42 having an external diameter of 10 mm, an internal diameter of 8 mm and a length of 300 mm. Next, another lead-wire-attached ring-like thermoelectric element 22 was inserted on the SUS tube 42 so that the respective thermoelectric elements were not contacted to one another. Then, the other end of the lead wire 31 fitted in the recess 24a of one ring-like thermoelectric element 22 having been inserted on the SUS tube 42 was made to be fitted in the recess 24b on the inner circumference surface 22b of another lead-wire-attached ring-like thermoelectric element 22. This was repeated several times to obtain the tubular element unit 21 comprising 100 ring-like thermoelectric elements 22.

Then, after silver plates as the electrodes 32 to be connected to external portions were attached to the ring-like thermoelectric elements 22 on both edges with silver paste, the tubular element unit 21 was supported by the SUS tube 43 having an external diameter of 22 mm, an internal diameter of 20 mm and a length of 300 mm to obtain the thermoelectric conversion module 10 comprising 100 ring-like thermoelectric elements 22 shown in FIG. 2. In addition, on a contact portion of the outer circumference surface 42a of the SUS tube 42 with the inner circumference surfaces 22b of the ring-like thermoelectric elements 22 was applied silicon grease to reduce heat resistance and execute insulation processing. Also, on a contact portion of the inner circumference surface 43b of the SUS tube 43 with the outer circumference surfaces 22a of the ring-like thermoelectric elements 22 was applied alumina cement to execute insulation processing.

<Evaluation of Electric Generating Characteristics>

The thermoelectric conversion module 10 comprising 100 ring-like thermoelectric elements 22 was set in a small tubular furnace having a core tube of 300 mm in length (length of the heater: 250 mm), and the outer circumference surface of the thermoelectric conversion module 10 was heated at 400 degrees C. Water was applied in the inner tube to cool it. When the temperature difference between the SUS tube 43 and the SUS tube 42 was 320 degrees C., 4.64V open-circuit voltage and 5.2 W maximum output were obtained.

FIG. 5B shows another embodiment. One end of the silver plate lead wire 31 is fitted in the recess 24a of the ring-like thermoelectric element 22 and is fixed with silver paste to obtain the ring-like thermoelectric element 22 with the lead wire 31 in whose recess 24a one end of the lead wire 31 has been fitted (hereinafter referred to as "lead-wire-attached ring-like thermoelectric element 22"). One lead-wire-attached ring-like thermoelectric element 22 is inserted on a SUS tube 42' that is a temporary support unit and is one of the assembly jigs subsequently after a ring-like insulator 222 (e.g., alumina tube) has been inserted thereon. Next, another lead-wire-attached ring-like thermoelectric element 22 is inserted on the SUS tube 42' subsequently after a ring-like insulator 222 (e.g., alumina tube) has been inserted thereon in the similar manner. Then, the other end of the lead wire 31 fitted in the recess 24a of the ring-like thermoelectric element 22 inserted on the SUS tube 42' previously (e.g., first thermoelectric element) is adapted to be fitted in the recess 24b on the inner circumference surface 22b of another lead-wire-attached ring-like thermoelectric element 22 inserted on the SUS tube 42' (e.g., second thermoelectric element). This is repeated several times to be able to obtain the thermoelectric conversion module comprising as many ring-like thermoelectric elements 22 as desired. The ring-like thermoelectric element 22 and the ring-like insulator 222 can be fixed to each other with a predetermined adhesive, and when predetermined bond strength is obtained, the SUS tube 42' is pulled out to be able to complete the thermoelectric conversion module.

The invention claimed is:
1. A thermoelectric conversion module, comprising:
a tubular unit, comprising a plurality of thermoelectric elements each having a shape of a disk with a circular aperture, said thermoelectric elements coaxially arranged with an insulator sandwiched between a pair of the thermoelectric elements formed adjacent to each other, the thermoelectric elements each having inner and outer circumferential surfaces substantially entirely covered with electrodes and generating electricity by a temperature differential between the inner circumferential surfaces and the outer circumferential surfaces, said plurality of thermoelectric elements comprising sintered bodies of a single type;

a connecting member for electrically connecting a first one of the electrodes that covers the outer circumferential surface of a first one of the thermoelectric elements to a second one of the electrodes that covers the inner circumferential surface of a second one of the thermoelectric elements, the first one and second one of the electrodes being formed adjacent to each other, said connecting member being of a single, contiguous, and homogenous composition; and a cylindrical support, comprising an inner tube and an outer tube that are coaxially configured and electrically insulated, wherein an outer circumferential surface of the inner tube is in contact with and supports the inner circumferential surfaces of each of the thermoelectric elements, and wherein an inner circumferential surface of the outer tube is in contact with and supports the outer circumferential surfaces of each of the thermoelectric elements.

2. The thermoelectric conversion module according to claim 1, wherein said plurality of thermoelectric elements comprises sintered bodies of only a single type.

3. The thermoelectric conversion module according to claim 1, wherein said sintered bodies comprise a composite metal oxide that includes indispensable calcium and manganese in addition to a trivalent or higher metal element.

4. The thermoelectric conversion module according to claim 1, wherein a pair of recesses covered with electrodes is formed in the inner and outer circumferential surface of each of the thermoelectric elements, and wherein a first portion of the connecting member mates with a first one of the recesses in the first one of the thermoelectric elements and a second portion of the connecting member mates with a second one of the recesses in the second one of the thermoelectric elements.

5. The thermoelectric conversion module according to claim 4, wherein said connecting member comprises:

a first flat plate oriented in a longitudinal direction;

a second flat plate extending horizontally from an end of the first flat plate, said first portion of the connecting member comprising the second flat plate; and a third flat plate extending horizontally from an other end of the first flat plate in an opposite direction from that of the second flat plate, said second portion of the connecting member comprising the third flat plate.

6. The thermoelectric conversion module according to claim 1, wherein an amount of the thermoelectric elements included in the tubular unit is in a range from 50 to 200.

7. The thermoelectric conversion module according to claim 1, wherein said sintered bodies comprise a perovskite-type composite oxide expressed by $Ca_{(1-x)}M_xMnO_3$, where M is a trivalent or higher metal element and $0.001 \leq x \leq 0.05$.

8. The thermoelectric conversion module according to claim 1, wherein said thermoelectric elements have an external diameter in a range of 10 mm to 40 mm, an internal diameter in a range of 5 mm to 35 mm, and a thickness in range of 2 mm to 5 mm.

9. The thermoelectric conversion module according to claim 1, wherein said insulator has a shape of a ring.

10. The thermoelectric conversion module according to claim 1, wherein said insulator comprises an alumina tube.

11. A thermoelectric conversion module, comprising:

a plurality of thermoelectric elements coaxially arranged with a predetermined distance spaced between the thermoelectric elements and comprising sintered bodies of a single type, each of the thermoelectric elements having a shape of a disk with a circular aperture and generating a predetermined electromotive force with a temperature difference between an outer circumferential surface and an inner circumferential surface of each of the thermoelectric elements, each of the thermoelectric elements comprising:

an outer circumferential electrode that covers the outer circumferential surface of each of the thermoelectric elements; and an inner circumferential electrode that covers the inner circumferential surface of each of the thermoelectric elements;

a connecting member electrically connecting an adjacent pair of the thermoelectric elements by electrically connecting the outer circumferential electrode of one of the adjacent pair of the thermoelectric elements to the inner circumferential electrode of an other of the adjacent pair of the thermoelectric elements, said connecting member being of a single, contiguous, and homogenous composition; and a heat blocking member for restricting a transfer of a substance comprising at least one of gas, electricity, and heat between outer circumferential surfaces and inner circumferential surfaces of the thermoelectric elements.

12. The thermoelectric conversion module according to claim 11, wherein said heat blocking member comprises an inner tube that is in contact with inner circumferential surfaces of said plurality of thermoelectric elements.

13. The thermoelectric conversion module according to claim 11, wherein a pair of recesses covered with electrodes is formed in the inner and outer circumferential surfaces of each of the thermoelectric elements, the pair of recesses being positioned in a symmetrical manner with respect to a radial direction of each of the thermoelectric elements, wherein a first portion of the connecting member mates with one of the recesses in the one of the adjacent pair of the thermoelectric elements, and wherein a second portion of the connecting member mates with an other of the recesses in the other of the adjacent pair of the thermoelectric elements.

14. The thermoelectric conversion module according to claim 11, wherein said plurality of thermoelectric elements comprises sintered bodies of only a single type.

* * * * *